(12) United States Patent
Steinhardt et al.

(10) Patent No.: US 10,059,596 B2
(45) Date of Patent: Aug. 28, 2018

(54) HYPERUNIFORM AND NEARLY HYPERUNIFORM RANDOM NETWORK MATERIALS

(71) Applicant: The Trustees of Princeton University, Princeton, NJ (US)

(72) Inventors: Paul J. Steinhardt, Princeton, NJ (US); Salvatore Torquato, Princeton, NJ (US); Miroslav Hejna, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 14/891,568

(22) PCT Filed: May 9, 2014

(86) PCT No.: PCT/US2014/037455
§ 371 (c)(1),
(2) Date: Nov. 17, 2015

(87) PCT Pub. No.: WO2014/189690
PCT Pub. Date: Nov. 27, 2014

(65) Prior Publication Data
US 2016/0075563 A1    Mar. 17, 2016

Related U.S. Application Data

(60) Provisional application No. 61/825,261, filed on May 20, 2013.

(51) Int. Cl.
*C01B 33/02* (2006.01)
*H01L 31/0376* (2006.01)

(52) U.S. Cl.
CPC ........ *C01B 33/02* (2013.01); *H01L 31/03762* (2013.01); *Y02E 10/548* (2013.01)

(58) Field of Classification Search
CPC .......................... C01B 33/02; H01L 31/03762
See application file for complete search history.

(56) References Cited

U.S. PATENT DOCUMENTS 5,147,826 A    9/1992  Liu et al. ............. 438/486

FOREIGN PATENT DOCUMENTS

TW        201219595       5/2012

OTHER PUBLICATIONS

Barkema and Mousseau, "High-Quality Continuous Random Networks." *Physical Review B*, 62:4985-4990 (2000).
Batten, et al., "Classical Disordered Ground States: Super-Ideal Gases and Stealth and Equi-Luminous Materials." *Journal of Applied Physics*, 104(3):033504-033512 (2008).
(Continued)

*Primary Examiner* — Melvin C. Mayes
*Assistant Examiner* — Michael Forrest
(74) *Attorney, Agent, or Firm* — Medlen & Carroll, LLP

(57) ABSTRACT

This invention is in the field of physical chemistry and relates to novel hyperuniform and nearly hyperuniform random network materials and methods of making said materials. Methods are described for controlling or altering the band gap of a material, and in particular commercially useful materials such as amorphous silicon. These methods can be exploited in the design of semiconductors, transistors, diodes, solar cells and the like.

22 Claims, 6 Drawing Sheets

(56) References Cited

OTHER PUBLICATIONS

Batten, et al., "Inherent Structures for Soft Long-Range Interactions in Two-Dimensional Many-Particle Systems." *Journal of Chemical Physics*, 135(5):054104-054116 (2011).
Beaucage and Mousseau, "Nucleation and Crystallization Process of Silicon Using the Stillinger-Weber Potential." *Physical Review B: Condensed Matter and Materials Physics*, 71:94102 (2005).
Blétry, "Sphere and Distance Models for Binary Disordered Systems." *Philosophical Magazine B*, 62:469-508 (1990).
Cheng, et al., "Observations of Structural Order in Ion-Implanted Amorphous Silicon." *Journal of Materials Research*, 16:3030-3033 (2001).
Coffa, et al., "Mechanisms of Ion-Beam-Emhanced Diffusion in Amorphous-Silicon." *Physical Review B*, 45:8355-8358 (1992).
deGraff and Thorpe, "The Long-Wavelength Limit of the Structure Factor of Amorphous Silicon and Vitreous Silica." *Acta Crystallographica Section A*, 66:22-31 (2010).
Djordjevic, et al., "Computer Model of Tetrahedral Amorphous Diamond." *Physical Review B*, 52(8):5685-5689 (1995).
Donev, et al., "Unexpected Density Fluctuations in Jammed Disordered Sphere Packings." *Physical Review Letters*, 95:090604 (2005).
Elliot, "Origin of the First Sharp Diffraction Peak in the Structure Factor of Covalent Glasses." *Physical Review Letters*, 67:711-714 (1991).
Florescu, et al., "Complete Band Gaps in Two-Dimensional Photonic Quasicrystals." *Physical Review B*, 80:155112 (2009a).
Florescu, et al., "Designer Disordered Materials with Large, Complete Photonic Band Gaps." *Proceedings of the National Academy of Sciences*, 106(49):20658-20663 (2009b).
Florescu, et al., "Effects of Random Link Removal on the Photonic Band Gaps of Honeycomb Networks." *Applied Physics Letters*, 97(20):201103-201103 (2010).
Fried, et al., "Determination of Complex Dielectric Functions of Ion Implanted and Implanted Annealed Amorphous Silicon by Spectroscopic Ellipsometry." *Journal of Applied Physics*, 71:5260-5262 (1992).
Gibson, et al., "Substantial Crystalline Topology in Amorphous Silicon." *Physical Review Letters*, 105:125504 (2010).
Haberl, et al., "Structural Characterization of Pressure-Induced Amorphous Silicon." *Physical Review B*, 79(15):155209 (2009).
Haberl, et al., "Unexpected Short- and Medium-Range Atomic Structure of Sputtered Amorphous Silicon Upon Thermal Annealing." *Journal of Applied Physics*, 110(9):096104-096103 (2011).
Hopkins, et al., "Nonequilibrium Static Diverging Length Scales on Approaching a Prototypical Model Glassy State." *Physical Review E*, 86(2):021505 (2012).
Ilaysky, et al., "Ultra-Small-Angle X-Ray Scattering at the Advanced Photon Source." *Journal of Applied Crystallography*, 42(3):469-479 (2009).
Keating, "Effect of Invariance Requirements on the Elastic Strain Energy of Crystals with Application to the Diamond Structure." *Physical Review*, 145(2):637-645 (1966).
Kwon, et al., "Transferable Tight-Binding Models for Silicon." *Physical Review B*, 49(11):7242-7250 (1994).
Laaziri, et al., "High-Energy X-Ray Diffraction Study of Pure Amorphous Silicon." *Physical Review B*, 60:13520-13533 (1999a).
Laaziri, et al., "High Resolution Radial Distribution Function of Pure Amorphous Silicon." *Physical Review Letters*, 82:3460-3463 (1999b).
Lebowitz, "Charge Fluctuations in Coulomb Systems." *Physical Review A*, 27(3):1491-1494 (1983).
Marcotte, et al., "Nonequilibrium Static Growing Length Scales in Supercooled Liquids on Approaching the Glass Transition." *Journal of Chemical Physics*, 138(12):12A508-510 (2013).
Moss and Price, "Random Packing of Structural Units and the First Sharp Diffraction Peak in Glasses." In Adler, et al., (Eds.), *Physics of Disordered Materials* (pp. 77-94). New York: Plenum (1985).

Mousseau, et al., "Recent Developments in the Study of Continuous Random Networks." *Philosophical Magazine B*, 82(2):171-183 (2002).
Nakhmanson, et al., "Realistic Models of Paracrystalline Silicon." *Physical Review B*, 63:235207 (2001).
Philip, "Decay of the Pair Correlations and Small-Angle Scattering for Binary Liquids and Glasses." *Journal of Physics: Condensed Matter*, 18(50):11443 (2006).
Price, et al., "Intermediaterange Order in Glasses and Liquids." *Journal of Physics: Condensed Matter*, 1:1005-1008 (1989).
Roorda, et al., "Calorimetric Evidence for Structural Relaxation in Amorphous Silicon." *Physical Review Letters*, 62:1880-1883 (1989).
Roorda, et al., "Edge Supported Amorphous Silicon Membranes for Diffraction Studies." *Nuclear Instruments and Methods in Physics Research Section B*, 148:360-365 (1999).
Roorda, et al., "Disentangling Neighbors and Extended Range Density Oscillations in Monatomic Amorphous Semiconductors." *Physical Review Letters*, 108(25):255501 (2012).
Steeb and Lamparter, "Diffraction Studies of Liquid and Amorphous-Alloys." *Journal of Non-Crystalline Solids*, 61-62:237-248 (1984).
Stillinger and Weber, "Computer Simulation of Local Order in Condensed Phases of Silicon." *Physical Review B*, 31(8):5262-5271 (1985).
Stolk, et al., "Contribution of Defects to Electronic, Structural, and Thermodynamic Properties of Amorphous-Silicon." *Journal of Applied Physics*, 75:7266-7286 (1994).
Torquato and Stillinger, "Local Density Fluctuations, Hyperuniformity, and Order Metrics." *Physical Review E*, 68(4 Pt. 1):041113 (2003).
Treacy and Borisenko, "The Local Structure of Amorphous Silicon." *Science*, 335:950-953 (2012).
Tsu, et al., "Determination of Energy Barrier for Structural Relaxation in a-Si and a-Ge by Raman-Scattering." *Journal of Non-Crystalline Solids*, 66:109-114 (1984).
Tsu, et al., "Determination of the Energy Barrier for Structural Relaxation in Amorphous Si and Ge by Raman-Scattering." *Solid State Communications*, 54:447-450 (1985).
Vink, et al., "Towards Device-Size Atomistic Models of Amorphous Silicon." *Physical Review B*, 64:245214 (2001a).
Vink, et al., "Fitting the Stillinger-Weber Potential to Amorphous Silicon." *Journal of Non-Crystalline Solids*, 282(2-3):248-255 (2001b).
Vink, et al., "A Semi-Empirical Potential for Amorphous Silicon." *Journal of Non-Crystalline Solids*, 282:248-255 (2001c).
Waasmaier and Kirfel, "New Analytical Scattering-Factor Functions for Free Atoms and Ions." *Acta Crystallographica Section A*, 51(3):416-431 (1995).
Weaire and Thorpe, "Electronic Properties of an Amorphous Solid. I. A Simple Tight-Binding Theory." *Physical Review B*, 4(8):2508-2520 (1971).
Wochner, et al., "X-Ray Cross Correlation Analysis Uncovers Hidden Local Symmetries in Disordered Matter." *Proceedings of the National Academy of Sciences*, 106(28):11511-11514 (2009).
Wooten, et al., "Computer Generation of Structural Models of Amorphous Si and Ge." *Physical Review Letters*, 54:1392 (1985).
Xie, et al., "Order and Disorder in Freestanding Pure Amorphous Silicon and Amorphous Silicon over Si(001)." *Journal of Non-Crystalline Solids*, 357:2498-2501 (2011).
Zachariasen, "The Atomic Arrangement in Glass." *Journal of the American Chemical Society*, 54(10):3841-3851 (1932).
Zachary, et al., "Hyperuniformity, Quasi-Long-Range Correlations, and Void-Space Constraints in Maximally Random Jammed Particle Packings. I. Polydisperse Spheres." *Physical Review E*, 83(5):051308 (2011a).
Zachary, et al., "Hyperuniformity, Quasi-Long-Range Correlations, and Void-Space Constraints in Maximally Random Jammed Particle Packings. II. Anisotropy in Particle Shape." *Physical Review E*, 83(5):051309 (2011b).
Zammit, et al., "Optical Absorption Studies of Ion-Implantation Damage in Si on Sapphire." *Physical Review B*, 49:14322-14330 (1994).

(56) References Cited

OTHER PUBLICATIONS

Hejna, "Nearly-Hyperuniform Network Models of Amorphous Silicon." Open Access Theses and Dissertations, Princeton University, Abstract, Date Available: Jan. 1, 2013. Retrieved from the Internet: URL:http://oatd.org/oatd/record?record=oai\:dataspace.princeton.edu\:88435\%2Fdsp018049g5173, 2013.

Hejna, et al., "Nearly-Hyperuniform Network Models of Amorphous Silicon." Physical Review B, 87(24):245204 (Online Mar. 2, 2013).

Hejna, et al., "Nearly-Hyperuniform Network Models of Amorphous Silicon." Physical Review B, 87(24):245204 (Jun. 2013).

Ilaysky, et al., "High-Energy Ultra-Small-Angle X-Ray Scattering Instrument at the Advanced Photon Source." *Journal of Applied Crystallography*, 45(6):1318-1320 (2012).

HYPERUNIFORM AND NEARLY HYPERUNIFORM RANDOM NETWORK MATERIALS

STATEMENT OF GOVERNMENTAL SUPPORT

This invention was made with government support awarded by the United States Department of Energy Office of Basic Energy Sciences, Division of Materials Sciences and Engineering under Award DE-FG02-04-ER46108. The government has certain rights in the invention.

FIELD OF THE INVENTION

This invention is in the fields of condensed matter physics and physical chemistry and relates to novel hyperuniform and nearly hyperuniform random network materials and methods of making said materials. Methods are described for controlling or altering the electronic band gap of a material, and in particular commercially useful materials such as amorphous silicon. These methods can be exploited in the design of semiconductors, transistors, diodes, solar cells, photovoltaic cells and the like.

BACKGROUND OF THE INVENTION

Every solid has its own characteristic electronic energy band structure. This variation in band structure is responsible for the wide range of electrical properties observed in various materials. In semiconductors and insulators, electrons are confined to a number of bands of energy. The term "band gap" refers to the energy difference between the top of the valence band and the bottom of the conduction band. Electrons are able to jump from one band to another, but no electron states can exist within the band gap However, in order for an electron to jump from a valence band to a conduction band, it requires a specific minimum amount of energy for the transition.

Band gap engineering is the process of controlling or altering the band gap of a material. What is needed are improved methods for controlling or altering band gaps in materials.

SUMMARY OF THE INVENTION

This invention is in the fields of condensed matter physics and physical chemistry and relates to novel hyperuniform and nearly hyperuniform random network materials and methods of making said materials. Methods are described for controlling or altering the electronic band gap of a material, and in particular commercially useful materials such as amorphous silicon ("a-Si"). These methods can be exploited in the design of semiconductors, transistors, diodes, solar cells, photovoltaic cells and the like.

In one embodiment, the present invention contemplates thermal annealing of a material for periods of time that are longer than conventional in order to increase the degree of hyperuniformity. For example, in the case of amorphous silicon, the present invention contemplates in one embodiment, thermal annealing (e.g. at a temperature of between 400° C.-800° C. and typically approximately 600° C.) for a time period of between 0.5 and 5 hours, and typically 1 hour. In a preferred embodiment, this thermal annealing is done under pressure. For example, in one embodiment, said annealing is performed under pressures (compression) of 6-10%, and typically 8%. In one embodiment, said annealing is performed under pressures (compression) of 10 to 30 gigapascals (GPa), see Table 6.

Thus, in one embodiment, the present invention contemplates a method comprising: a) thermal annealing amorphous silicon for at least one hour and b) measuring the degree of hyperuniformity. In one embodiment, the degree of hyperuniformity is measured by determining the observed value S(k→0) (as used herein, this value is used interchangeably with "S(q→0)" and the shorthand term "S(0)"). In one embodiment, S(k→0) is less than 0.035. In one embodiment, the observed value S(k→0) is less than 0.028. In yet another embodiment, the observed value is less than 0.016. In still another embodiment, the observed value is approximately 0.0075.

The present invention also contemplates, in one embodiment, an iterative process whereby testing is done after annealing to determine the degree of hyperuniformity, whereupon further annealing is done to increase the degree of hyperuniformity, while avoiding crystallization. Thus, in one embodiment, the present invention contemplates a method comprising: a) thermal annealing an amorphous tetrahedrally-coordinated solid (e.g. amorphous silicon) for a first period of time to create a first treated composition, b) measuring the degree of hyperuniformity of said first treated composition, c) thermal annealing said first treated composition for a second period of time to create a second treated composition, and d) measuring an increase in the degree of hyperuniformity in said second treated composition as compared to said first treated composition. In one embodiment, the method further comprises e) thermal annealing said second treated composition for a third period of time to create a third treated composition, and f) measuring an increase in the degree of hyperuniformity in said third treated composition as compared to said second treated composition. It is not intended that the present invention be limited to the length of each time period. Nonetheless, in one embodiment, the length of said first period of time and said second period of time together is at least one hour, and preferably greater than one hour. It is not intended that the present invention be limited to the temperature used for thermal annealing in this interative process. In one embodiment, the temperature is between 400° C.-800° C. and typically approximately 600° C. for the various steps of thermal annealing. However, in one embodiment, the temperature is reduced (e.g. to approximately 500° C.) during the second time period (as compared to the first) to gain additional control over the process and avoid crystallization. In one embodiment, the temperature is further reduced (e.g. to less than 500° C., and typically approximately 400° C.) for said third time period. During this interative process, continued annealing of a-Si samples improves the degree of hyperuniformity. Moreover, the simulations suggest that quenching a-Si samples under increased pressure leads to further improvements in the degree of hyperuniformity. Thus, in one embodiment, the iterative process described above is done under increased pressure. In one embodiment, said annealing is performed under pressures (compression) of 10 to 30 gigapascals (GPa), see Table 6.

The present invention contemplates that a higher degree of hyperuniformity corresponds to a larger measured bandgap of the material (e.g. a-Si). Thus, the method controls or alters band gaps in a material. As noted below, the largest measured band-gap of a-Si was observed in annealed material which exhibits the largest degree of hyperuniformity.

The present invention also contemplates the resulting product of thermal annealing as a composition of matter. Therefore, in one embodiment, the present invention contemplates a composition comprising thermally annealed amorphous tetrahedrally-coordinated solid (e.g. amorphous silicon), wherein the observed value S(k→0) is less than 0.035. In one embodiment, the observed value S(k→0) is less than 0.028 for the composition. In one embodiment, the observed value S(k→0) is less than 0.016. In one embodiment, the observed value S(k→0) is approximately 0.0075.

It is not intended that the present invention be limited to compositions of amorphous silicon and methods of treating amorphous silicon. Indeed, the methods of the present invention are generally applicable to amorphous tetrahedrally-coordinated solids, including but not limited to germanium, silicon dioxide and the like.

DEFINITIONS

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims Energy is carried in an electromagnetic wave or oscillating "field" in one direction indefinitely at the speed of light (in a vacuum) until the wave encounters an object that reflects it, absorbs it, delays it (as in "refraction"), or distorts it (as in "diffraction"). Electromagnetic waves can also interact ("interfere") with one another, additively to increase amplitude, or subtractively to reduce and even extinguish amplitude.

The amount of electromagnetic energy that impinges on an object in any given period of time depends on how many waves (counted by their "crests," for example) reach the object during that period ("frequency") and the height of the wave (the "amplitude"). Short wavelengths mean high frequency, which, for a given amplitude, means more energy. Thus, electromagnetic energy can be denominated as frequency or as the number of waves that pass through a given space at a given speed ("wavenumber"). It is to be noted that since waves have both speed (or magnitude) and direction, they are vectors, symbolized herein by the bolded letter k. The magnitude of k is |s|. The (angular) wavenumber (k) of an electromagnetic wave is inversely proportional to the wavelength and is equal to |k|.

A "point pattern," as the term is used herein, refers to a configuration of loci that may be used to derive a map or "blueprint" on which one may fabricate articles that embody the invention.

The "structure factor" of a molecular structure is a measure of the probability that the material will scatter a wave of wavenumber k, which in turn, is affected by the arrangement of the scatter-points in the material. A structure factor may also be referred to as a "structure function," "power spectrum," "power density spectrum" or "S(k)". The "order" of a point-pattern in a material relates herein to a property exhibited by a population of points arranged or distributed in an array along a line, or in n-dimensional space. That property may be measured in terms of a local "number variance." In any sampling window in which one inspects a region of the structure, one will find a certain point-density (e.g., points per unit volume). By moving the sampling window repeatedly without changing its size (i.e., its volume in a three-dimensional structure), and counting the number of points encountered in the window each time the window is moved, one may readily determine the average number of points observed and the variance in the number observed for that window size. As one changes the size (surface or volume) of the window, the number variance in the observed point-density will vary in a way that depends upon how the points in the population are ordered. If the points are distributed randomly in the material (i.e., according to Poisson statistics) or distributed in a disordered way typical of liquids, the increase in the volume of the observation window and the increase in number variance will be equal. If distributed hyperuniformly, the increase in number variance will grow as a power of the volume that is less than one so that the ratio of number variance to the volume decreases towards zero as the volume grows. For example, for some hyperuniform patterns, the number variance grows in proportion to the surface area. In physical systems, structure functions and power spectra provide information about how points of mass, charge, energy, etc. distribute themselves in the system. A crystal is an example of a physical system comprising points that scatter impinging radiation ("scatter-points"). The radiation that scatters from the crystal depends on the crystal's structure function which, in turn, depends on the extent to which—and the manner in which—the density of scatter-points fluctuates through the crystal.

To rationalize the concept of "order" in point-patterns, at least three types of "order" are referred to herein. "Random order" refers to structures having point-patterns such that the statistics of point-density fluctuations in any (normalized) sample of the structure (e.g., the sample variance) are consistent with a random (or "Poisson") distribution. Stated quantitatively, the number variance of a purely random point-pattern in two dimensions or three dimensions varies exactly as the area (d=2) or the volume (d=3) of the window varies, where d refers to the Euclidean space dimension The number variance of a hyperuniform point pattern grows as a power of the volume that is less than one so that the ratio of number variance to the volume decreases towards zero as the volume grows. For example, for some hyperuniform patterns, the number variance grows in proportion to the surface area. The ratio of the surface area to the volume approaches zero as the volume increases.

A subclass of hyperuniform patterns is called "stealthy" if, for a certain set of wavelengths that includes k=0 (that is, a range of wavenumbers between k=0 and k=$k_c$). A light-scattering structure built according to such a point-pattern will not scatter light for the wavelengths for which the structure factor is exactly zero (S(k0)). Quantitatively, $<N_R^2>-<N_R>^2=AR^p$, where the brackets refer to averages over many independent sampling windows of radius R. The relation determines the number variance in an average window of radius R ($N_R$ being the number of points lying within the window), where p≥d−1 and p<d. This means that the number variance must grow more slowly than the volume of the window in three dimensions (that is, 2≤p<3), or more slowly than the surface area of the window in two dimensions (1≤p<2). For example, it is common for p to be equal to 2 or 1 in three or two dimensions, respectively. The test for hyperuniformity in point-patterns is provided in greater detail by Torquato et al. in *Phys. Rev. E* 68: 41113, 2003 [1]. The power p and the proportionality constant A for the relation above determines the degree of hyperuniformity, smaller values reflecting greater hyperuniformity.

DESCRIPTION OF THE FIGURES

The accompanying figures, which are incorporated into and form a part of the specification, illustrate several embodiments of the present invention and, together with the description, serve to explain the principles of the invention. The figures are only for the purpose of illustrating a preferred embodiment of the invention and are not to be construed as limiting the invention.

DESCRIPTION OF THE INVENTION

Figure 1:
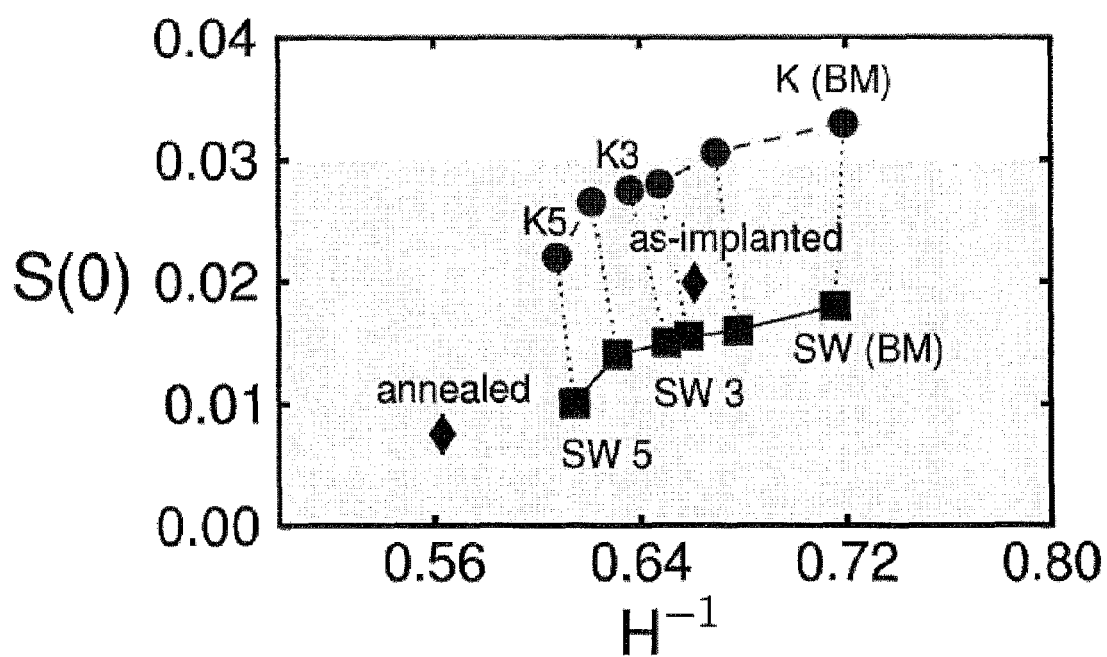
FIG. 1 shows S(0) vs. the inverse height H of the first scattering peak for the K (BM) Keating annealed continuous random network model [2] and the Keating annealed models (circles) and the corresponding Stillinger-Weber quenched models (squares). The shaded region indicates the nearly hyperuniform range in which S(k→0) is below the equilibrium melting value for a-Si; note that the SW models are substantially below this threshold.

Herein, the concept of nearly hyperuniform network (NHN) structures is introduced as alternatives to the conventional continuous random network (CRN) models for amorphous tetrahedrally-coordinated solids, such as amorphous silicon (a-Si). A hyperuniform solid has a structure factor S(k) that approaches zero as the wavenumber k→0; herein a NHN is defined as an amorphous network whose structure factor S(k→0) is smaller than the liquid value at the melting temperature. Herein, using a novel implementation of the Stillinger-Weber potential for the interatomic interactions, it is shown that the energy landscape for a spectrum of NHNs includes a sequence of local minima with an increasing degree of hyperuniformity (smaller S(k→0)) that correlates with other measurable features in S(k) at intermediate and large k and with the width of the electronic band gap.

The development of accurate structural models of amorphous silicon (a-Si) and other amorphous tetrahedrally-coordinated solids has been an active area of research for the last eight decades [5-7], but many challenges remain. The structure of a-Si is approximated well by continuous random network (CRN) models [6, 7], the first of which was introduced by Zachariasen in 1932 [5]. Conventional CRNs for a-Si are fully four-coordinated, isotropic disordered networks that contain primarily five, six and seven atom rings, while maintaining nearly perfect local tetrahedral coordination (with narrow bond-angle and bond-length distortions). Predictions derived from CRN models assuming a Keating potential describes the interatomic interactions are in good agreement with many structural properties of a-Si that are accessible via experiments, including the radial distribution function (RDF) and the phonon and electron density of states [3, 7, 8], nearest and next-nearest neighbors distances, bond statistics, ring statistics, etc. These successes are related to the form of the structure factor S(k) at intermediate wavenumbers k.

Herein, the concept of nearly-hyperuniform network (NHN) structures is introduced and, on the basis of computer simulations, it is proposed that NHN models may provide a better description of a-Si, especially after annealing. A perfectly hyperuniform solid has a structure factor S(k) that approaches zero as the wavenumber k→0, implying that infinite-wavelength density fluctuations vanish [1]. The CRN models based on the Keating model that have been considered in the past (e.g., [3]) have values of S(k→0) comparable to those found in the liquid phase at the equilibrium melting temperature, S(k→0)≈0.03. a nearly hyperuniform network is defined as a disordered tetrahedral structure whose S(k→0) is less than the liquid value at melting. As a practical matter, focus is upon cases where S(k→0) is substantially less, by a factor of two or more.

Employing a novel simulation procedure that is based on the Stillinger-Weber (SW) potential to model the interatomic interactions, a spectrum of NHN models have been generated and it is shown that the energy landscape includes a sequence of progressively more hyperuniform minima with values S(k→0) that are substantially less than the melting value—by a factor of two or more. It is further shown that the degree of hyperuniformity correlates with other measurable signatures in S(k) at intermediate and large k and with the width of the electronic band gap. The simulations suggest that the sequence of states can be reached through extensive annealing, and more efficiently when combined with pressure.

While the SW potential has been shown to give a more realistic description of crystalline silicon [9], the energy penalty for dangling bonds is not sufficiently large, and hence quenches from the melt, via molecular dynamics, result in an unrealistic number of coordination defects. These defects are avoided in conventional CRN models by using the less realistic Keating potential that enforces perfect fourfold coordination.

Herein, a novel two-step numerical protocol has been devised to produce a spectrum of NHN models that combines the advantages of the Keating and SW potentials. Step one is a standard bond-switching annealing procedure using a Keating potential [10] applied to 20,000 atoms within a cubic box (under periodic boundary conditions) that is augmented with procedural modifications introduced by Barkema and Mousseau (BM) [3, 11]. However, unlike the BM CRN model, the annealing of the current invention systems are significantly longer (between 2 to 250 times as long as measured by the number of accepted transpositions) to achieve a sequence of inherent structures (local potential-energy minima) that have lower energies than those of the BM model. In the second step of the current procedure, the end-state inherent-structure configurations used are obtained via a Keating potential (K1, K2, etc.) as initial conditions for atomic-position rearrangement under a modified SW potential [8, 12] at zero pressure via a conjugate gradient method. The same parameters of the SW potential were used that were determined by fitting the phonon spectra of a-Si to neutron scattering data [8]. The corresponding inherent structures of this SW potential are respectively labeled SW1, SW2, etc. With this two-step procedure, the resulting structures possess a negligible number of dangling bonds. In FIG. 1, $S(0)$ is shown as a function of the inverse of the height of the first scattering peak in $S(k)$ for the Barkema-Mousseau CRN model, for the Keating anneals, and for the subsequent Stillinger-Weber quenches. The experimental values of $S(0)$ for the as-implanted and annealed a-Si samples, also shown in FIG. 1, are consistent with the nearly hyperuniform network picture.

The first step of this two-step procedure involves producing a highly annealed CRN model based on the Keating potential as an initial condition for a SW quench. Barkema and Mousseau used an accelerated and scalable modification of Wooten Winer and Weaire (WWW) technique [13] to produce large Keating-relaxed CRN models that have been a standard in the field. Herein several improvements have been introduced to the Barkema-Mousseau algorithm, which, together with faster computers, allow generation of significantly higher quality CRNs.

The starting point of the WWW technique is a disordered, perfectly four-coordinated network of atoms in a periodic box. Following the suggestion by Barkema and Mousseau [3], the current invention started from a liquid-like configuration to avoid any memory of an initial crystalline state. This disordered network is evolved through a sequence of bond switches, that are accepted with Hastings-Metropolis acceptance probability $$P=\min[1, \exp(-\Delta E_s/k_B T)],$$

where $k_B$ is the Boltzmann constant, T is the temperature, and $\Delta E_s$ is the change of energy due to the bond switch, evaluated from the Keating potential [14]:

$$E_{Keat.} = \frac{3}{16}\frac{\alpha}{d^2}\sum_{i,j}(r_{ij} \cdot r_{ij} - d^2)^2 + \frac{3}{16}\frac{\beta}{d^2}\sum_{i,j,k}\left(r_{ij} \cdot r_{ik} + \frac{1}{3}d^2\right)^2$$

Here $\alpha$, $\beta$ are the bond-stretching and bond-bending constants respectively, and d is the equilibrium bond length.

Since the acceptance rate is less than 0.1% in a well annealed network, it is important to avoid a complete relaxation of trial configurations and reject the proposed move as soon as it becomes clear that the move will be rejected. To that end, Barkema and Mousseau have proposed that a move be rejected if the Keating force exceeds a certain threshold value [3]. In addition, a multiscale local cluster relaxation methodology is introduced, which consists of the following steps:

(1) Only atoms in a small cluster of about 120 atoms around a switched bond are relaxed, with the bond-switch being rejected if the energy increases by more than a threshold value of 0.01 eV per atom in the cluster.
(2) If not rejected in step (1), atoms in a larger cluster of about 320 atoms around the switched bond are relaxed, with the bond-switch being accepted or rejected based on the Hastings-Metropolis acceptance probability.
(3) Relaxation of all the atoms is performed after about a hundred accepted moves to relieve any built up stress due to the local relaxation.

Performing only local relaxations is crucial to the scalability of the algorithm, while using multiple scales increases efficiency. An important speed-up is achieved by parallelization. An asynchronous master-worker parallelization paradigm was used, where the master proposes transpositions and workers report on their success, instead of a bulk synchronous parallelization proposed by Vink et al. [11].

In the current procedure, the annealing temperature is slowly decreased from about 0.3 eV to about 0.15 eV per silicon atom. Following Barkema and Mousseau, a zero temperature quench was performed every several thousand successful transpositions at the annealing temperature. During the annealing-quenching procedure, the ratio of the two-body and three body interaction was varied by 5% and the volume of the system by 3%. It was determined that a significant speed-up of the quenches can be achieved by preferentially trying switching bonds that have the highest strain and the bonds that lie in the neighborhood of previously successful bond-switches, since the successful bond-switches often appear in clusters. Several models K1-K5 at various degree of annealing were produced whenever the Keating energy per atom showed a substantial decrease.

The second step of this two-step procedure to create a NHN model involves finding a zero-pressure inherent structure (local minimum) associated with a modified SW potential interaction. The SW potential [9] involves two- and three-body interactions of the following form:

$$E_{SW} = \sum_{i,j} v_2(r_{ij}) + \sum_{i,j,k} v_3(r_{ij}, r_{ik}, \cos\theta_{ijk}),$$

$$v_2(r_{ij}) = \varepsilon f_2(r_{ij}/\sigma),$$

$$v_3(r_{ij}, r_{ik}, \cos\theta_{ijk}) = \varepsilon f_3(r_{ij}/\sigma, r_{ik}/\sigma, \cos\theta_{ijk}),$$

where $$f_2(r) = \begin{cases} A(Br^{-p} - r^{-q})\exp[(r-a)^{-1}] & r < a \\ 0 & r \geq a \end{cases},$$

$$f_3(r_{ij}, r_{ik}, \cos\theta_{ijk}) = \lambda\exp[\gamma(r_{ij}-a)^{-1} + \gamma(r_{ik}-a)^{-1}]\left(\cos\theta_{ijk} + \frac{1}{3}\right)^2,$$

where $\varepsilon=1.6483$ eV, $A=7.050$, $B=0.6022$, $p=4$, $k=0$, $\alpha=1.80$, $\lambda=31.5$, $\gamma=1.20$, $\sigma=2.0951$ Å are parameters that were determined from fitting the location of transverse optic and transverse acoustic peaks to neutron scattering experiments on a-Si by Vink et al. [8].

The structure factor $S(k)$ of the generated samples were evaluated by the sampling volume method. This method is based on the scaling behavior of density fluctuations presented by Torquato & Stillinger [1] and described in detail by de Graff & Thorpe [2]. The method can be viewed as a Fourier transform of the pair-correlation function $g(r)$ with an appropriately chosen convergence factor that reduces artifacts due to the finite size of the model [2].

Results

In FIG. 1, $S(0)$ is shown as a function of the inverse of the height H of the first scattering peak in $S(k)$ for K (BM), the Barkema-Mousseau CRN model [2] as well as for K3, K5, SW3 and SW5 Importantly, it can be observed that K (BM) model is not an endpoint of annealing under the Keating potential, since further annealing produces a sequence K1 through K5 along a trajectory where $S(0)$ gets smaller and first peak height in S(k) gets larger. Moreover, the models obtained by then quenching under the SW potential are nearly hyperuniform: they have values of S(0) that are extend to more than 50% lower than their K progenitors and substantially below the value at the melting temperature. They also have substantially higher radial distribution function (RDF) first-peak heights (compare Table 1 and Table 2). The most nearly-hyperuniform structure obtained in the anneal run, K5, yields S(0)=0.010±0.002, which is appreciably smaller than that of the BM model [S(0)=0.035±0.001] [2]. It should be noted that the process was stopped with K5 because the annealing runs began to use unreasonable computational time; it may be possible that more refined hyperuniform amorphous networks are achievable with yet longer annealing times.

The SW5 model exhibits other signature features that correlate with increased hyperuniformity and can be measured experimentally:

(1) The SW5 structure possesses a bond-angle standard deviation that is more than a degree lower than that of the BM model and is in better agreement with recent bond-angle analysis of monatomic amorphous semiconductors [15]).

Figure 2:
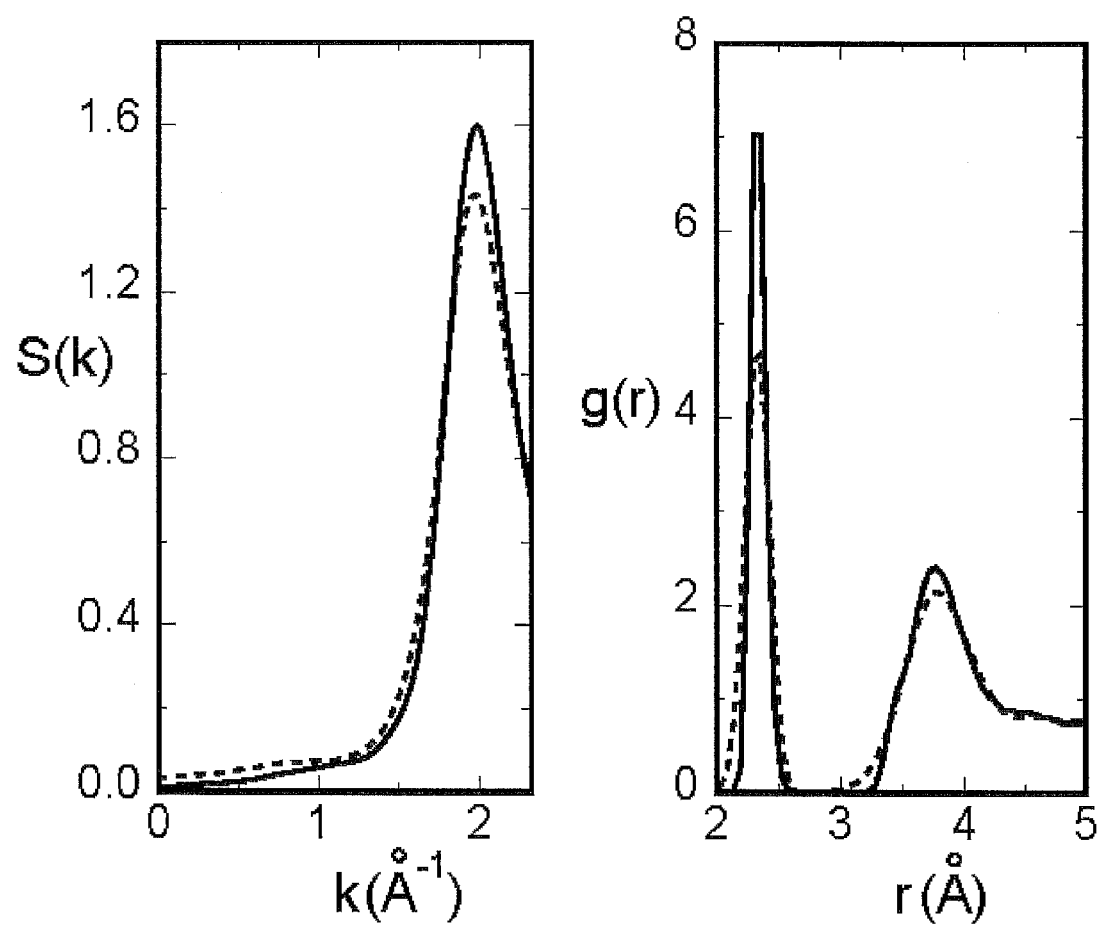
FIG. 2 shows (a) Comparison of the angularly averaged structure factor S(k) versus k for small to intermediate k for the Stillinger-Weber quenched SW5 model (blue solid curve) and the Keating annealed K (BM) model [3] (red dashed line). (b) Comparison of the first peak in radial distribution function g(r) versus radial distance r for the K (BM) model [3] (red dashed curve) and the SW5 model (blue solid curve).

(2) The height of the first peak of S(k) for the SW5 model is higher than for the BM model, as shown in FIG. 2(a) [16].

(3) The BM model has a significantly broader first peak in the RDF g(r) (due to a larger bond-length variation) than the SW5, as shown in FIG. 2(b).

Figure 3:
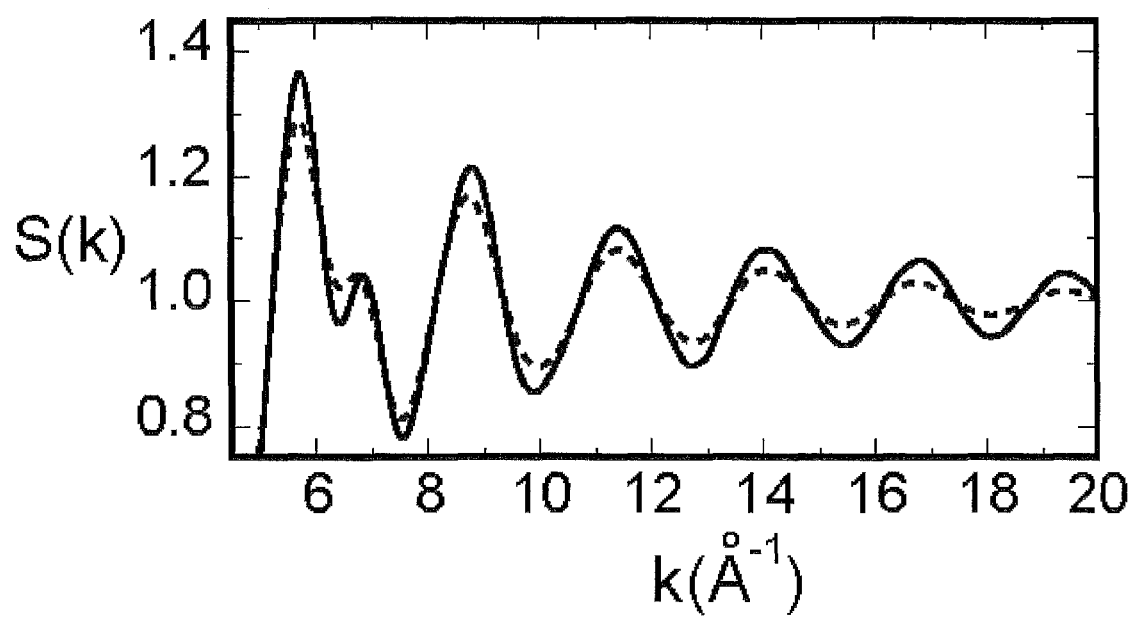
FIG. 3 shows the angularly averaged structure factor S(k) versus k at large k for the Stillinger-Weber quenched SW5 model (blue solid curve) displays larger amplitude oscillations than the Keating-annealed K (BM) model [3] (red dashed curve).

(4) For larger wavenumbers, the BM model predicts a significantly faster decay of the large-k oscillations in S(k) than does that of the SW5 model, as shown in FIG. 3.

Figure 4:
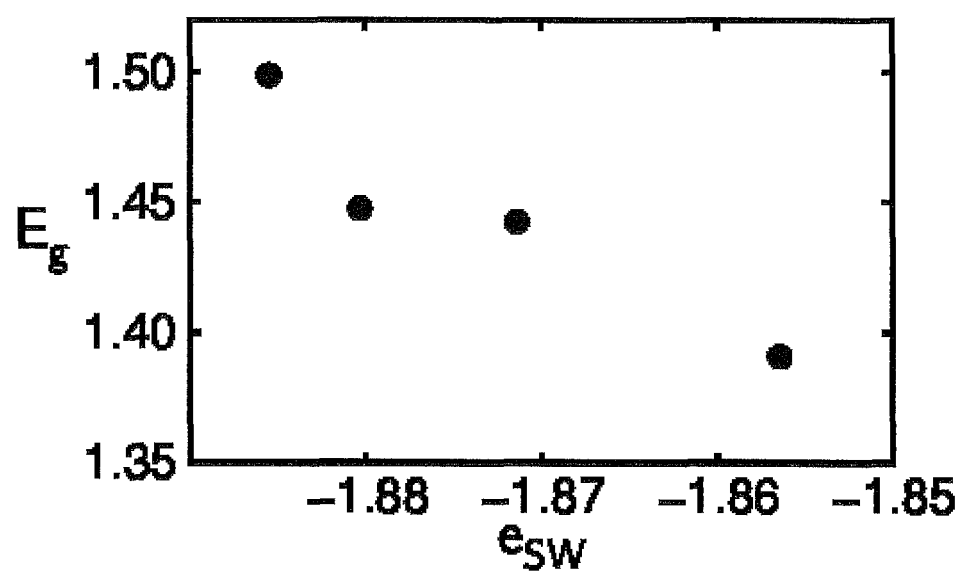
FIG. 4 shows the electronic band gap $E_g$ vs. the average SW energy per atom $e_{SW}$ (in units of $\epsilon$=1.6483 eV).

(5) Based on a simulations of smaller 1000-atom models and using a tight-binding model for silicon by Kwon [17], the electronic band gap increases with increasing hyperuniformity, as shown in FIG. 4. The width of the isotropic band gaps are calculated as the difference between the lowest energy state of the conduction band and the highest energy state of the valence band. The FIG. 4 shows that the fractional band gap width $\Delta E/E$, increases as the SW energy per atom decreases, which correlates with increasing relaxation and thus the hyperuniformity. $\Delta E$ is the band gap width and E is the energy of the midpoint of the band gap compared to the lowest energy valence state. The same absolute gap width, $\Delta E$, also increases with hyperuniformity.

Table 1 summarizes the structural properties of the Keating-relaxed CRN models with progressively higher level of annealing. K5, the most annealed model, has more than a degree lower bond angle deviation than Barkema-Mousseau models [3] (K (BM)). Short-range order of the models improves with annealing. Table 1 shows the standard deviation $\sigma_L$ of the bond length, standard deviation $\sigma_A$ of the bond angle, limit of the structure factor as $k \to 0$ and the height of the first-coordination shell peak in g(r).

TABLE 1

Short-ranged and long-ranged properties of the Keating-relaxed CRN models

| model | $\sigma_L$ | $\sigma_A$ | S(0) | g(r) max |
|---|---|---|---|---|
| K (BM) | 4.03% | 9.94° | 0.035 | 4.9 |
| K1 | 3.84% | 9.23° | 0.031 | 5.1 |
| K2 | 3.83% | 9.14° | 0.028 | 5.1 |
| K3 | 3.80% | 9.01° | 0.027 | 5.2 |
| K4 | 3.71% | 8.71° | 0.026 | 5.3 |
| K5 | 3.64% | 8.61° | 0.022 | 5.4 |

Table 2 summarizes the structural properties of the NHN models derived from the CRN models by a zero pressure minimization of the modified Stillinger-Weber potential. SW (BM) model is obtained from the Barkema-Mousseau CRN model [3] (K (BM)). Table 2 shows the standard deviation of the bond length, standard deviation of the bond angle, limit of the structure factor as $k \to 0$ and the height of the first-coordination shell peak in g(r).

TABLE 2

Short-ranged and long-ranged properties of the NHN models

| model | $\sigma_L$ | $\sigma_A$ | S(0) | g(r) max |
|---|---|---|---|---|
| SW (BM) | 2.70% | 10.5° | 0.018 | 7.3 |
| SW1 | 2.68% | 10.0° | 0.016 | 7.3 |
| SW2 | 2.68% | 9.8° | 0.015 | 7.3 |
| SW3 | 2.66% | 9.6° | 0.015 | 7.4 |
| SW4 | 2.66% | 9.3° | 0.014 | 7.4 |
| SW5 | 2.65% | 9.2° | 0.01 | 7.4 |

Table 3 compares the irreducible ring statistics of the Barkema-Mousseau CRN model [3] (K (BM)) and the most annealed model (K5). Medium-range order significantly improves with annealing, as seen by the increased number hexagons and smaller number of squares as well as 8 and 9 membered rings.

TABLE 3

Comparison of the Ring Statistics between the Barkema-Mousseau CRN model [3] (K (BM)) and the most annealed model (K5)

| | ring order | | | | | |
|---|---|---|---|---|---|---|
| | 4 | 5 | 6 | 7 | 8 | 9 |
| K (BM) | 2.39% | 45.50% | 74.10% | 51.00% | 15.70% | 4.10% |
| K5 | 0.99% | 42.80% | 85.00% | 53.90% | 12.90% | 2.60% |

Table 4 shows the average motion of atoms (measured by the configurational proximity metric $p_{12} = \sqrt{\Sigma_{k=1}^{N}|r_{i,k}-r_{f,k}|^2}/r_0$, where $r_{i,k}$, $r_{f,k}$ are the initial and final positions of atoms in the SW quench and $r_0$ is the mean nearest neighbor distance [18]) as a result of replacing the Keating interaction with the Stillinger-Weber interaction. This quantifies the configurational distance of the SW models from their K progenitors. The Keating energy ($e_K$) and Stillinger-Weber energy per atom ($e_{SW}$) of a CRN model and the Stillinger-Weber energy per atom ($e_{SW}$) of the corresponding SW model are also shown. SW (BM) model is obtained from the Barkema-Mousseau CRN model [3] (K (BM)).

TABLE 4

Energies per atom of the K and SW models under different interactions. $e_{SW}$ is given in units of the SW potential energy scale " = 1.6483 eV. $e_K$ is given in dimensionless units in which d = $(\sqrt{3})/2$ and $\alpha = d^2$. Energies of the diamond lattice are shownfor comparison. First column shows the distance of a SW modelfrom its K progenitor in terms of the proximity metric.

| model | prox. metric | $e_K$ (K) | $e_{SW}/\varepsilon$ (K) | $e_{SW}/\varepsilon$ (SW) |
|---|---|---|---|---|
| SW (BM) | 0.72% | 0.0213 | -1.7809 | -1.8264 |
| SW1 | 0.90% | 0.01864 | -1.8141 | -1.8505 |
| SW2 | 1.06% | 0.01833 | -1.8179 | -1.8532 |
| SW3 | 0.95% | 0.01794 | -1.8235 | -1.8553 |
| SW4 | 1.09% | 0.01685 | -1.8372 | -1.8645 |
| SW5 | 1.02% | 0.01648 | -1.8421 | -1.8660 |
| diamond | — | 0.00000 | -2.0000 | -2.0000 |

To ensure that the NHN configurations are truly amorphous, they were analyzed for the presence of 10-atom cages composed of four adjacent six-rings that constitute a basic building block of the diamond crystalline structure. The results show that the most annealed CRN sample, K5, has 0.02 10-atom cages per atom a tiny fraction compared to the perfect crystal that has one 10-atom cage per atom. Since the Stillinger-Weber relaxation produces only negligible amount of topological defects, the results for K models carry over to the corresponding SW models. The 10-atom cages are quite uniformly distributed throughout the volume, and there are no large clusters. Comparison of these results to a recent study of nucleation [19] shows that NHN models are far from crystallization.

Table 5 shows characteristics of the 10-atom cages of the models. The results for a crystalline and paracrystalline [20] model are shown for reference. The first column shows the number of diamond cages per atom; the second column shows the number of clusters of diamond cages per atom; the third column shows the size of the maximal cluster; the fourth column shows the average of the clusters and the fifth column shows the number of interior cages. Interior cages are defined as cages whose atoms and neighbors all lie within the same cluster. Clusters are collections of 10-cages in which each 10-cage shares one atom or more with at least one other 10-cage. Cage statistics of the K1-5 and SW1-5 models shows that while the current models are significantly more relaxed than the BM model, the models are very far from crystallinity or paracrystallinity.

Table 5: The table shows the number of 10-cages per atom (#cages); the number of clusters (cl.) per atom; the number of atoms in the largest cluster; the average cluster size; and the number of interior cages. The K1-5 and SW1-5 models all contain 20,000 atoms; the crystalline has N and the paracrystalline model has 1728 atoms.

TABLE 5

| model | #cages | #cl. per at. | max cl. | aver. cl. | #in. cg. |
|---|---|---|---|---|---|
| K/SW (BM) | 0.90% | $6.29 \times 10^{-3}$ | 40 | 12.6 | 0 |
| K1/SW1 | 1.60% | $8.30 \times 10^{-3}$ | 77 | 14.4 | 0 |
| K2/SW2 | 1.60% | $8.20 \times 10^{-3}$ | 87 | 14.6 | 2 |
| K3/SW3 | 1.60% | $8.10 \times 10^{-3}$ | 88 | 14.9 | 0 |
| K4/SW4 | 1.90% | $9.15 \times 10^{-3}$ | 48 | 15.5 | 0 |
| K5/SW5 | 2.20% | $9.95 \times 10^{-3}$ | 90 | 15.7 | 0 |
| paracryst. | 15.50% | $4.05 \times 10^{-3}$ | 746 | 122.7 | 67 |
| diamond cryst. | 100% | 1/N | N | N | N |

Table 6 shows values of $S(0)$ for a sequence of models that were obtained by a constant volume SW quench of CRN5 at various degrees of compression. Compression is expressed in terms of the relative compression of the linear scale compared to the linear scale of the sample at zero pressure (SW5). Uncertainty of $S(0)$ is 0.002.

TABLE 6

Dependence of S(0) on the relative compression of the linear scale during a constant volume SW quench

| rel. compr. | −4% | 0% | 4% | 8% |
|---|---|---|---|---|
| P(GPa) | −10 | 0.000 | 10 | 30 |
| S(0) | 0.017 | 0.010 | 0.009 | 0.007 |

The fact that the current annealing-quenching procedure produces a sequence of NHN models with an increasing degree of hyperuniformity (i.e., $S(0)$ tending to zero) has deep significance. First, it demonstrates that the energy landscape for conventional Keating-annealed CRN models, for Stillinger-Weber quenched models, and, hence, probably amorphous silicon has local minima that span a greater diversity of structures than was previously recognized and that, experimentally, it is possible to reach minima that are more nearly hyperuniform than had been thought achievable. In particular, the value of $S(0)$ cannot be considered a universal quantity for a-Si or any other amorphous tetrahedral network, as might be inferred from de Graff and Thorpe [2]. For example, while the percentage drop in the energy per atom in going from the K (BM) model to SW5 is about 23%, the corresponding drop in $S(0)$ is about 50%. Remarkably, the configurational proximity metric [18], which gauges the average local atomic movement required to transform one structure into another, is only about one percent of a bond-length with a corresponding percentage energy drop of only about 2.4% during the Stillinger-Weber (framework) quenching step from a Keating potential-annealed CRN to a SW potential-quenched NHN state, even though the latter possesses an $S(0)$ that is about one half the CRN value. This reveals the importance of collective atomic rearrangements during the second step of the current quenching protocol.

These findings are completely consistent with recent results for amorphous metals in which the atomic pair interactions are isotropic [21, 22]. In these studies, it has been demonstrated that, on approach to an inherent structure, $S(0)$ is nearly hyperuniform and decreases monotonically [21], and that $S(0)$ decreases as the temperature decreases. Also, deeper local minima in the energy landscape are accessed [22]. Thus, the observation that sampling deeper energy minima are accompanied by increased hyperuniformity appears to apply to a wide class of disordered systems (with both isotropic and directional interactions) and its full elucidation demands attention in the future.

Is it possible to construct a-Si with appreciably smaller $S(0)$ than reported here or, more ambitiously, reach true hyperuniformity ($S(k\to 0)=0$)? There are both fundamental and practical reasons to consider such questions. On the practical side, the results above suggest that hyperuniform amorphous tetrahedral network models will have larger electronic band gaps than typical non-hyperuniform samples [6]. Similar ideas have successfully led to the creation of novel designer materials composed of a hyperuniform disordered arrangement of dielectric materials that have complete photonic band gaps [23-25]. On the theoretical side, the present computational results strongly indicate that continued annealing of a-Si samples improves the degree of hyperuniformity. Moreover, the simulations suggest that quenching a-Si samples under increased pressure leads to further decrease of $S(0)$ (see Table 6 for dependence of $S(0)$ on compression).

Perfect hyperuniformity has been observed previously in disordered systems with hard, short-range isotropic interactions, most notably in a wide class of maximally random jammed packings [26-28]. It has also been found in systems with soft, long range interactions; for example, in one component plasmas [29] or in the ground states of so-called stealthy potentials [30] that enforce $S(k)=0$ for a k in a range [0, $k_C$], where $k_C>0$. The existence of these diverse examples and the construction here of a sequence of increasingly hyperuniform configurations suggests that the search for a configuration with $S(k\to 0)=0$ is one of the exciting areas for future research.

Even before the numerical studies of NHN models began, the general theoretical conjectures above stimulated recent measurements by Xie et al. [31] shown in the experimental section of the structure factor in the long-wavelength limit for a sample of a-Si synthesized by direct ion bombardment.

These experiments have measured S(k→0) to determine the degree of hyperuniformity both as-implanted and after annealing and have also checked several other correlated signatures predicted above.

EXPERIMENTAL

The following examples are provided in order to demonstrate and further illustrate certain preferred embodiments and aspects of the present invention and are not to be construed as limiting the scope thereof.

The results of highly sensitive transmission X-ray scattering measurements performed at the Advanced Photon Source, Argonne National Laboratory, on nearly-fully-dense high-purity amorphous-silicon (a-Si) samples for the purpose of determining their degree of hyperuniformity are reported here. A perfectly hyperuniform structure has complete suppression of infinite-wavelength density fluctuations, or, equivalently, the structure factor S(k→0)=0; the smaller the value of S(0), the higher is the degree of hyperuniformity. Annealing was observed to increase the degree of hyperuniformity where it was found that S(0)=0.0075 (+/−0.0005), which is significantly below the computationally determined lower bound recently suggested by de Graff and Thorpe [2], based on studies of continuous random network models, but consistent with the recently proposed nearly hyperuniform network picture of a-Si. The increased hyperuniformity is correlated with a narrower first sharp diffraction peak and an extended range of oscillations in the pair distribution function. These results also reveal a small feature at scattering vector k≈1 Å$^{-1}$ that has not been reported previously in a-Si.

After more than a half century of theoretical efforts and increasingly precise measurements, understanding the atomic scale structure of disordered solids remains an outstanding challenge [32]. Interest in this area continues unabated, as the link between structure and physical properties is key to the design of functional materials.

The behavior of the structure factor S(k) in the infinite wavelength (k→0) limit for a high-purity sample of amorphous silicon in order to determine its degree of hyperuniformity is examined The structure factor, S(k) is given by $$S(k) = \frac{1}{N}\left\langle \sum_{jk} e^{-ik(R_j-R_k)} \right\rangle, \text{ where } k = \left(\frac{4\pi}{\lambda}\right)\sin\theta,$$

N is the number of atoms, $R_j$ and $R_k$ are their positions, λ is the X-ray wavelength and 2θ is the scattering angle. By definition, a perfectly hyperuniform structure has infinite-wavelength density fluctuations that are completely suppressed and, hence, its structure factor S(q→0)=0 [1]. In general, the value S(q→0) measures the degree of hyperuniformity.

Ordered solids such as crystalline and quasicrystalline materials are trivially perfectly hyperuniform. Liquids are highly non-hyperuniform, but it is possible to have isotropic disordered solid structures that are perfectly hyperuniform [1]. This special class includes "maximally random jammed" (MRJ) packings of equal-sized spheres, for which it has been shown that S(k→0) vanishes linearly with k [26]. Moreover, one can explicitly construct a wide class of disordered hyperuniform point patterns using a "collective-coordinate" approach [30].

Determining where amorphous silicon falls in this spectrum was motivated by recent research on hyperuniform disordered photonic materials that exhibit complete (both polarizations) and sizeable photonic band gaps [23]. Florescu et al. [23] have argued that the existence of photonic band gaps in disordered photonic solids may be explained using theoretical ideas similar to those introduced by Weaire and Thorpe to explain the electronic band gap in amorphous semiconductors [33]. Although strict hyperuniformity is not required to have an electronic band gap according to the Weaire-Thorpe argument, the Florescu et al. study of photonic band gaps in hyperuniform versus non-hyperuniform photonic solids led them to conjecture that the electronic band gap in amorphous silicon should increase with the degree of hyperuniformity; that is, samples with smaller S(k→0) should have improved band-gap properties. An unresolved issue remained: how close to zero can S(k→0) get in amorphous silicon?

Theoretically, it is possible to construct a network structure with the topology of a tetrahedral continuous random network (CRN), the standard model for amorphous silicon, which has S(k→0) equal to zero [4]. However, beyond satisfying certain topological properties, an appropriate model must obey geometrical constraints on the distribution of bond distances and bond angles to be in accord with observations. Recent work by de Graff and Thorpe [2] suggests that geometric constraints may be incompatible with hyperuniformity. More specifically, they suggest a lower bound of S(k→0)=0.035+/−0.001, based on their computer simulations of a 100,000-atom CRN model for amorphous silicon, the largest such network model to date, relaxed using a Keating potential. Moreover, they point out that their bound is consistent with approximating amorphous silicon as a frozen liquid, whose density fluctuations have a similar value. Yet, recent explicit constructions have shown that it is theoretically possible to produce a spectrum of network structures with the same topology and nearly identical bond distance and angle distributions as CRN models but with a wide range of lower values of S(k→0). These constructions include what is termed "nearly hyperuniform network models," i.e., those structures possessing S(k→0) values that are an order of magnitude smaller than that of the aforementioned CRN model. Thus, it is not really clear how small S(k→0) can be in amorphous silicon [4].

These theoretical considerations have led to the measurement of the degree of hyperuniformity in some of the best-characterized experimental samples [16, 34] of nearly-fully-dense amorphous silicon. Pure, fully dense a-Si is difficult to prepare as it is over constrained, and hence it is a highly strained material. More than a decade ago, Roorda et al. [35] perfected a method for preparing high purity examples of a-Si by means of self-ion implantation into a Si (001) wafer and subsequent removal of the remaining single crystal substrate. The edgesupported, fully dense, bulk (12-micrometer-thick) a-Si samples from the earlier Laaziri work [34] were used in this investigation into possible hyperuniformity in a real and non-crystalline material.

A highly sensitive transmission X-ray scattering measurements at the Advanced Photon Source (APS) was performed to follow the course of S(k) in the limit as k→0. As demonstrated below, the scattering from an annealed (relaxed) a-Si sample is nearly hyperuniform. An analysis of the X-ray scattering features further reveals that improved hyperuniform ordering is associated with increasingly uniform short-range tetrahedral ordering (i.e., less distortion).

Samples and Scattering Measurements

The samples are nearly-fully-dense a-Si prepared [35] by means of self-ion implantation at 12 different energies and fluences at 77 K into single crystal Si (001). One of the 12-μm-thick a-Si membranes on single crystal Si substrates was annealed in vacuum at 600° C. for one hour to create an annealed "relaxed" structure, while another was "as-implanted." A wet chemical etch was applied to a 5-mm-diameter area in the center of the back of each 2 cm×2 cm wafer, removing the c-Si and leaving a freestanding, edge-supported membrane of high purity a-Si.

A (250 μm×250 μm) beam of 17 keV X rays, in vacuum, and a sample-to detector distance of 293 mm was used to measure the scattering intensity in the transmission geometry from each of the membranes. The measurements were immediately repeated with 9 keV X rays to cover a combined scattering vector range from $k=0.08$ Å$^{-1}$ to 2.4 Å$^{-1}$. The 17 keV data included the first sharp diffraction peak near $k=2$ Å$^{-1}$. This was important for two reasons. It enabled verification that the amorphous scattering volume was free from nucleation of nanocrystalline silicon. If nucleation were present, it would be detected through the appearance of a very sharp tiny (111) scattering feature on the principle peak. Secondly, as the extended S(k) oscillates about unity, it made possible a comparison to the full scattering curve that had been measured earlier out to $k=55$ Å$^1$ [16, 34]. These samples, which had been investigated extensively in 1998, are remarkably stable, yielding the same measured results for S(k) from the annealed (relaxed) and the as-implanted samples as 11 years earlier.

The X-ray scattering intensity data were corrected for background scattering, detector dark field, intensity calibration, sample absorption and X-ray polarization factor. The first calibration was made by means of a rotating glassy carbon secondary standard previously measured on the absolute-calibrated APS Ultra-Small Angle X-ray Scattering (USAXS) instrument [36]. The new scattering intensity data corresponded exactly to the earlier data [16, 34] after the sample thicknesses was set to 12.7 μm as determined from an independent absolute calibrated USAXS measurement. This internal consistency assures the integrity of the measurements.

Figure 5:
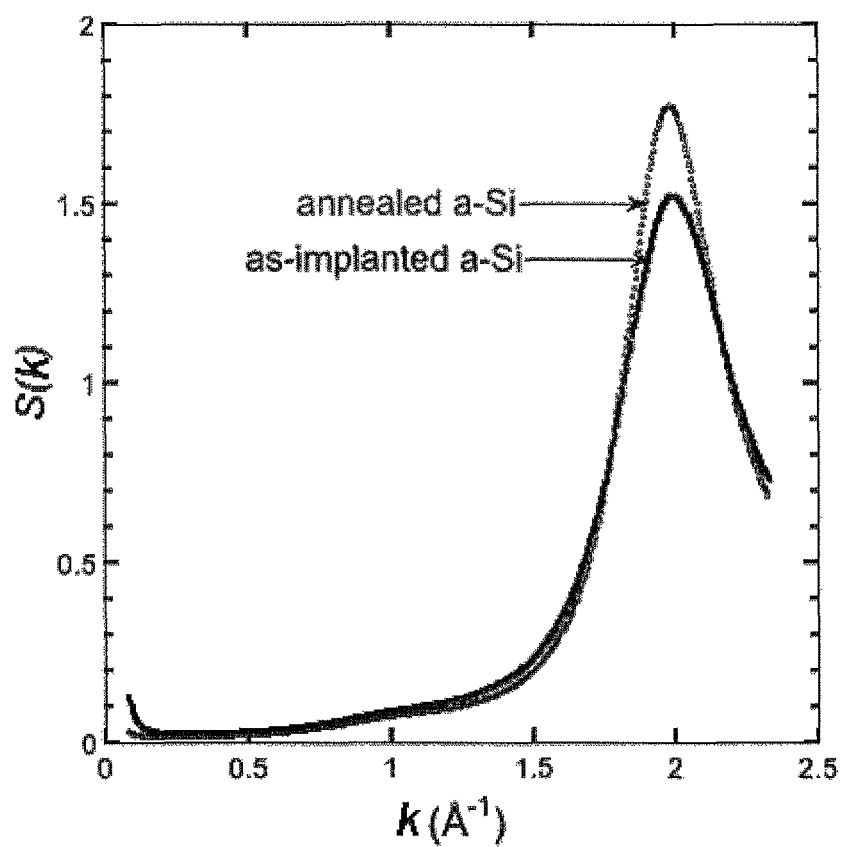
FIG. 5 shows experimental S(k) for the as-implanted a-Si (solid squares) and the annealed (relaxed) a-Si (open triangles).

The calibrated intensity was converted to S(k) in electron units/atom making use of published atomic scattering factors [37] and the known density of the a-Si. FIG. 5 shows the experimentally determined S(k) for the two samples. The intensity of the principal (first sharp) diffraction peak is greater and the peak width is narrower for the annealed (relaxed) a-Si than for the as-implanted a-Si. The curves cross at $k \approx 1.75$ Å$^{-1}$, below which more scattering is recorded in the scattering curve from the as-implanted sample.

To examine whether there was any structural memory in the a-Si of the c-Si from which it was created, an X-ray cross-correlation analysis was performed [38] of scattering intensity around the principle peak diffraction ring and found no anisotropy or preferred directions within either of the edge supported a-Si membranes. A similar analysis of a-Si on c-Si showed well-defined anisotropy at the amorphous-Si-tocrystalline-Si interface along the Si <110> directions [39].

Results and Discussion

At the lowest values of k, there is an upturn in the measured S(k) that may be attributed mainly to small-angle scattering from surface roughness and secondarily from a very small amount of nanoporosity. Scattering from surface roughness is suspected because one side of the samples is matte rather than shiny, as a result of the chemical etch that was used to remove the crystal substrate. A new sample was made by direct ion implantation into a 10-micrometer-thick c-Si membrane that had been polished on both sides. Indeed, in this sample the upturn was much reduced. Since large k-range (2.5 Å$^{-1}$-55 Å$^{-1}$) data are not available for this sample, the analysis of the older (etched) samples was continued.

Before correcting for the small-angle scattering, an upper limit on S(k→0) can be derived by extrapolating a flat line from the minimum value of S(k) to k=0. This procedure yields S(0)upper limit=0.026 and 0.016 for the as-implanted and annealed (relaxed) a-Si, respectively. Note that these values are below the computationally determined lower bound of S(0)=0.035 suggested by de Graff and Thorpe [2], and that the value for annealed a-Si is lower than that for as-implanted a-Si.

Figure 6:
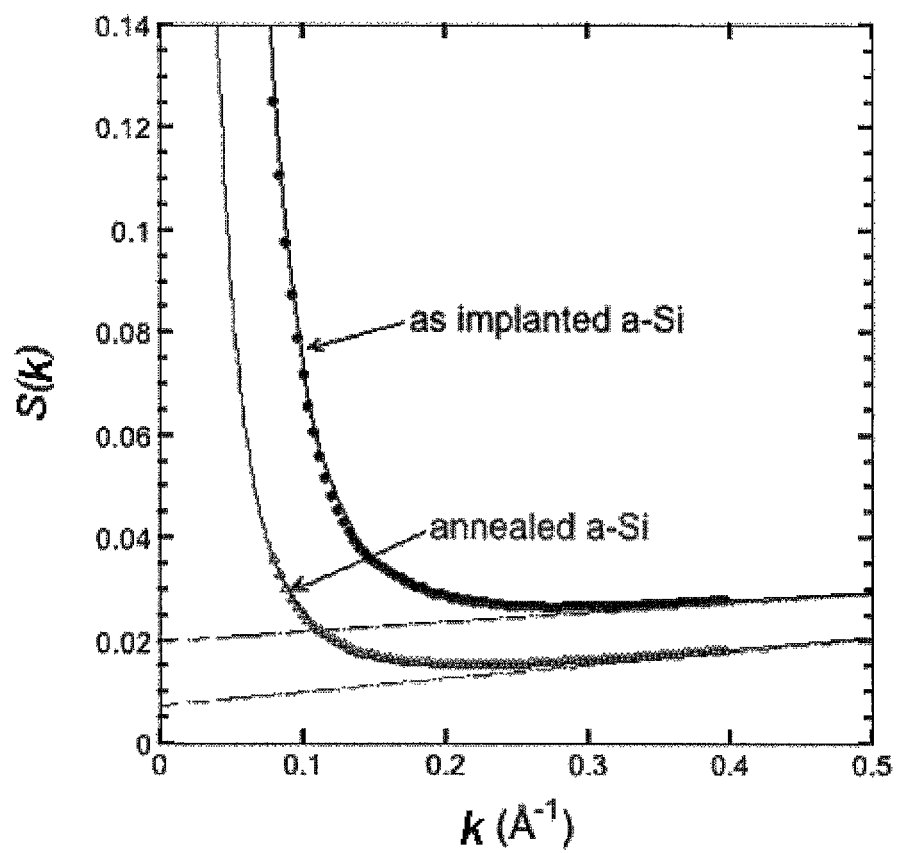
FIG. 6 shows S(k) at low k for the as-implanted a-Si (solid circles) and the annealed (relaxed) a-Si (open triangles). Note that the minimum S(k) for both as-implanted and annealed is less than 0.03, below the theoretical bound based on continuous random network models relaxed with Keating potentials or on treating a-Si as a frozen liquid [4]. To obtain S(k→0), the data are fit (solid curves) to a sum of an inverse power-law in k, representing small angle scattering mostly from a rough etched surface, and a linear contribution. The dashed lines show the linear contribution only. The plot shows that this ansatz fits well (see text for details). The degree of hyperuniformity was measured to be S(k→0)=0.0199+/−0.0005 for the as-implanted and S(k→0)=0.0075+/−0.0005 for the annealed a-Si.

Of greater interest than the singular value of S(0) is the manner in which the measured S(k) behaves as k→0. To determine this, S(k) was fit between $k=0.08$ Å$^{-1}$ and 0.4 Å$^{-1}$ to the form S(k)=a k$^b$+S(k→0)+S'(k→0) k, where the first term is an approximation to the small-angle X-ray scattering (i.e., including both Guinier and Porod scattering from a range of surface feature sizes) and the last terms describe the linear contribution to S(k) at small k. The measured S(k), the best overall fits, and the best-fit linear contribution are shown in FIG. 6, where the fit is shown with solid lines. The exponent, b, representing the surface scattering is −3.34±0.02 for the as-implanted sample and −2.40±0.03 the annealed (relaxed) sample. The linear portion of the fit is shown with dashed lines. It was found that S(k→0)=0.0199+/−0.0005 and 0.0075+/−0.0005 for the as-implanted and annealed (relaxed) a-Si, respectively. It is clear that annealing increases the degree of hyperuniformity, although both are consistent with nearly hyperuniform network models [4] and have S(k→0) significantly lower than the de Graff-Thorpe lower bound [2].

The more general six-parameter fitting function of the form S(k)=a k$^b$+c k$^d$+S(k→0)+S'(k→0) k have also been considered. The best-fit S(k→0) is less than the value reported above with essentially the same goodness of fit. Hence, the values above could be considered conservative upper bounds.

The values of the terminal slopes are 0.0188 (±0.0009) Å and 0.0260 (±0.0005) Å for the as-implanted and annealed (relaxed) a-Si, respectively. It is noteworthy that the linear approximation is a good fit to the behavior of S(k) for small wavenumber and agrees with what has been observed in MRJ sphere packings [30].

When results from earlier studies [16, 34] are combined with those from the present work, it is noted that the radial distribution function (RDF) indicated that a number of changes were induced by thermal annealing: increased coordination number C1, narrower tetrahedral angle distribution ΔΘ, and increased dihedral angle ordering F(φ). Recent analysis [15] also found extended range density oscillations in the pair distribution function with an exponential decay length Λ that increased upon annealing, and with a periodicity close to the size of a tetrahedral Si unit. Each of these parameters ($C_1$, ΔΘ, F(φ), or Λ) can be taken as an indicator of the state of relaxation of the network.

The experiment [16, 34] found that the nearest neighbor coordination number $C_1$ goes from 3.79 to 3.88 when a-Si is thermally annealed. This result implies that annealed a-Si is closer to ideal nearly hyperuniform network models [4] than as-implanted a-Si.

The bond angle distribution ΔΘ for the as-implanted and annealed samples were reported as 10.45°±0.09° and 9.63°±0.08° respectively [16]. These experimental values were derived from the width of the second peak in the radial distribution function. It has since been found [15] that the second peak includes a contribution from third nearest neighbors and that the value for $\Delta\Theta$ as deduced from the width of the second peak may be overestimated by 1.5°.

Thermal annealing of the current samples also leads to the appearance of a small feature in the RDF around 4.8 Å, indicating ordering of the dihedral angles. The decay length $\Lambda$ of the extended range density oscillations observed in the samples [39] increased upon annealing from 1.2±0.4 to 1.8±0.3 bond lengths. Indeed, the physical properties of a-Si will vary according to the preparation method (e.g., pressure induced instead of ion implantation), but thermal annealing leads to a convergence of those properties to a relatively well-defined common state [40].

The 105-atom model [2] used to predict $S(k\rightarrow 0)$ of a-Si made use of the Keating interatomic potential; several other properties that the model calculates demonstrate why it may overestimate the limit of long wavelength scattering. For example, the width of the bond angle distribution, at 9.6°, the lack of third neighbor ordering [41], and the long range ordering decay length (at 0.89 bond lengths) all indicate that the model is perhaps best viewed as one describing a form of a-Si even less structurally relaxed than the as-implanted material. By contrast, a spectrum of nearly hyperuniform network models [4] have been constructed with $S(k\rightarrow 0)$ ranging from 0.035 to below the experimental values reported here while maintaining virtually the same bond distance and bond angle distribution as CRN models. The data from both the as-implanted and annealed a-Si samples are consistent with the nearly hyperuniform network picture.

Nearly hyperuniform network models [4] are derived by means of a two-step numerical protocol that combines the Keating and Stillinger-Weber potentials. The first step is a standard bond-switching annealing procedure using a Keating potential [10] that is augmented with Barkema-Mousseau modifications [3]. However, unlike the Barkema-Mousseau CRN model, the structures are annealed between 2 to 250 times longer to achieve a sequence of inherent structures (local potential-energy minima) that have lower energies than those of the Barkema-Mousseau CRN model. In the second step, each of the configurations obtained via a Keating potential is used as the initial condition for atomic-position rearrangement under a modified Stillinger-Weber potential [12] at zero pressure via a conjugate gradient method. With this two-step procedure, the resulting structures possess a negligible number of dangling bonds. In FIG. 1, $S(0)$ is shown as a function of the inverse of the height of the first scattering peak in $S(k)$ for the Barkema-Mousseau CRN model [2], for the Keating anneals, and for the subsequent Stillinger-Weber quenches. The experimental values of $S(0)$ for the as-implanted and annealed a-Si samples, also shown in FIG. 1, are consistent with the nearly hyperuniform network picture.

In FIG. 1, Values of $S(0)$ for the network structural models progressively relaxed with a Keating potential as a function of the inverse height H of the first scattering peak. Solid red circles (with examples labeled by K(BM) represent the original Barkema-Mousseau model and K1 through K5 are a series of progressive relaxations). The Keating-relaxed models serve as initial conditions for the subsequently quenched Stillinger-Weber structures, which appear as solid blue squares (with corresponding examples labeled by SW). The experimental values for as-implanted a-Si and annealed a-Si appear as solid green diamonds. The trajectory of the experimental values fits well with the modified Stillinger-Weber results. The shaded region below $S(0)=0.03$ indicates the nearly hyperuniform range in which $S(0)$ is below the equilibrium melting value for a-Si.

Recent fluctuation electron microscopy (FEM) measurements combined with electron diffraction have led to the suggestion [20, 42] that as-prepared a-Si possesses topology closely related to crystalline silicon, or that it is "paracrystalline." In particular, the claim is that a-Si is heterogeneous on a nanometer length scale and consists of paracrystallites embedded in a disordered (not necessarily CRN) matrix [20]. If this were correct, it could be argued that $S(k\rightarrow 0)$ would be expected to vanish or be very small. The paracrystalline argument, however, is inconsistent with the trends observed in the current data. Fluctuation electron microscopy has repeatedly inferred that annealing of a-Si leads to a reduction in the paracrystallinity by a factor of 2 to 10 [40, 43, 44], thus predicting that $S(k\rightarrow 0)$ should be lower in the as-implanted material than in the annealed material. This is the opposite of what was observed. It could be concluded that the observed low value for $S(k\rightarrow 0)$ is indeed a signature of hyperuniformity consistent with the nearly hyperuniform network picture [4].

$S(k)$ for both as-implanted and annealed samples exhibits a small broad peak that has not been reported previously. This feature is close to $k=1$ Å$^{-1}$, and well below the first sharp diffraction peak near $k=2$ Å$^{-1}$ (see FIG. 5). The peak in the as implanted sample has greater intensity than that in the annealed (relaxed) sample. The as-implanted feature is also broader, indicating a smaller correlation length in the as-implanted sample than the annealed (relaxed) sample.

Diffraction peaks between $k=1$ and 2 Å$^{-1}$ have been a subject of intense interest [45, 46] because their appearance at low k indicates that they arise from intermediate range ordering at distances of order>4 Å rather than from nearest neighbors. It thus offers potential insights into the packing of structural clusters. For glasses that include two or more atomic species, a sharp pre-peak has been explained in terms of chemical clustering and concentration-concentration correlations. In metallic glasses, the pre-peak has been associated with minority species ordering [47]. However, for a disordered material consisting of a single element such as a-Si, such interpretations are not possible. A possible explanation is a small number of vacancies or vacancy clusters [47-49]; these vacancies would need to be partially ordered for the pre-peak to appear. If indeed the intensity of the small feature scales with vacancy-vacancy correlations, then this would be consistent with the fact that there are fewer vacancies in the annealed (relaxed) a-Si with coordination≈3.88, than in the as-implanted a-Si with coordination of≈3.79. It should be noted, however, that the small feature has been found in nearly hyperuniform network models without dangling bonds or defects [4].

The discovery of a high degree of hyperuniformity, and the observation that thermal annealing not only relaxes the a-Si but also increases the degree of hyperuniformity, provides new insights into the nature of a-Si. Other properties of a-Si, such as the Raman TO-like peak width [50, 51], metal impurity solubility and diffusivity [52], and carrier lifetime and electronic density of states [53] have been observed to undergo changes upon thermal annealing, all showing that annealed a-Si is a better-defined, less defected, lower-energy state than as prepared a-Si [54]. One such property that could be of concern in particular is the band gap, in view of the prediction that a higher degree of hyperuniformity is related to a larger band gap.

Band gaps for pure a-Si (not hydrogenated a-Si:H), derived from measured complex dielectric functions, vary depending on the preparation history [55], where self-ion implanted samples had a bandgap of 0.85 eV, evaporated samples had a bandgap of 1.12 eV, but annealed samples (3 h at 500° C.) had the broadest bandgap of 1.30 eV [53, 56]. Indeed, the largest measured band-gap of a-Si was observed in annealed material, which exhibits the largest degree of hyperuniformity, confirming the predicted behavior.

Summary

High-sensitivity X-ray scattering data indicate that as-implanted and annealed (relaxed) a-Si have a nearly hyperuniform disordered atomic structure. The observed value of $S(k\rightarrow 0)=0.0075$ (+/−0.0005) for annealed a-Si is significantly smaller than a theoretical lower bound offered by de Graff and Thorpe [2]. Furthermore, annealing increases the degree of hyperuniformity ($S(k\rightarrow 0)$ is smaller). Since both as-implanted and annealed a-Si have smaller $S(k\rightarrow 0)$ than found for the largest current continuous random network models based on the Keating potential, it is fair to conclude that these models and approximations fail to explain the structure of nearly fully dense amorphous silicon. On the other hand, the result is consistent with nearly hyperuniform network model studies [4] which have led to large computer models r that produce $S(k\rightarrow 0)$ well below the lower bound on $S(k\rightarrow 0)$ values suggested by de Graff-Thorpe [2] while maintaining reasonable bond distance and bond angle distributions.

The results herein demonstrate that $S(k\rightarrow 0)$ is a useful figure-of-merit for comparing amorphous network solids, such as amorphous silicon. Further information is contained in the shape of $S(k)$ as $k\rightarrow 0$: in the case of the samples, the linear behavior in the samples and the associated slope. It should be noted that hyperuniform MRJ packings consisting of nonspherical particles have a spectral function that goes to zero linearly for small k and the associated slope is related to the degree of shape anisotropy [28]. Investigations of $S(k\rightarrow 0)$ and the shape as $k\rightarrow 0$ for photonic solids suggest that they correlate with photonic band gap properties. Here, it is observed that the same holds for the electronic band gap and perhaps other physical properties (e.g., mechanical properties) in amorphous semiconductors.

Although the invention has been described with reference to these preferred embodiments, other embodiments can achieve the same results. Variations and modifications of the present invention will be obvious to those skilled in the art and it is intended to cover in the appended claims all such modifications and equivalents. The entire disclosures of all applications, patents, and publications cited above, and of the corresponding application are hereby incorporated by reference.

REFERENCES

1. Torquato, S. and Stillinger, F. H. (2003) "Local density fluctuations, hyperuniformity, and order metrics," *Physical Review E* 68(4 Pt. 1), 041113.
2. de Graff, A. M. R. and Thorpe, M. F. (2010) "The long-wavelength limit of the structure factor of amorphous silicon and vitreous silica," *Acta Crystallographica Section A* 66, 22-31.
3. Barkema, G. T. and Mousseau, N. (2000) "High-quality continuous random networks," *Physical Review B* 62, 4985-4990.
4. Hejna, M. et al. "Nearly-Hyperuniform Network Models of Amorphous Silicon," (in preparation).
5. Zachariasen, W. H. (1932) "The Atomic Arrangement in Glass," *J. Am. Chem. Soc.* 54(10), 3841-3851.
6. Zallen, R. (1998) *The Physics of Amorphous Solids*, Wiley.
7. Mousseau, N. et al. (2002) "Recent developments in the study of continuous random networks," *Philosophical Magazine B* 82(2), 171-183.
8. Vink, R. L. C. et al. (2001) "A semi-empirical potential for amorphous silicon," *J. Non-Cryst. Solids* 282, 248-255.
9. Stillinger, F. H. and Weber, T. A. (1985) "Computer simulation of local order in condensed phases of silicon," *Physical Review B* 31(8), 5262-5271.
10. Djordjevic, B. R. et al. (1995) "Computer model of tetrahedral amorphous diamond," *Physical Review B* 52(8), 5685-5689.
11. Vink, R. L. C. et al. (2001) "Towards device-size atomistic models of amorphous silicon," *Physical Review B* 64, 245214.
12. Vink, R. L. C. et al. (2001) "Fitting the Stillinger-Weber potential to amorphous silicon," *J. Non-Cryst. Solids* 282(2-3), 248-255.
13. Keating, P. N. (1966) "Effect of Invariance Requirements on the Elastic Strain Energy of Crystals with Application to the Diamond Structure," *Physical Review* 145(2), 637-645.
14. Wooten, F. et al. (1985) *Phys. Rev. Lett.* 54, 1392.
15. Roorda, S. et al. (2012) "Disentangling Neighbors and Extended Range Density Oscillations in Monatomic Amorphous Semiconductors," *Phys. Rev. Lett.* 108(25), 255501.
16. Laaziri, K. et al. (1999) "High-energy X-ray diffraction study of pure amorphous silicon," *Physical Review B* 60, 13520-13533.
17. Kwon, I. et al. (1994) "Transferable tight-binding models for silicon," *Physical Review B* 49(11), 7242-7250.
18. Batten, R. D. et al. (2011) "Inherent structures for soft long-range interactions in two-dimensional many-particle systems," *J. Chem. Phys.* 135(5), 054104-054116.
19. Beaucage, P. and Mousseau, N. (2005) "Nucleation and crystallization process of silicon using the Stillinger-Weber potential," *Phys. Rev. B: Condens. Matter Mater Phys.* 71, 94102.
20. Treacy, M. M. J. and Borisenko, K. (2012) "The local structure of amorphous silicon," *Science* 335, 950-953.
21. Hopkins, A. B. et al. (2012) "Nonequilibrium static diverging length scales on approaching a prototypical model glassy state," Physical Review E 86(2), 021505.
22. Marcotte, E. et al. (2013) "Nonequilibrium static growing length scales in supercooled liquids on approaching the glass transition," *J. Chem. Phys.* 138(12), 12A508-510.
23. Florescu, M. et al. (2009) "Designer disordered materials with large, complete photonic band gaps," *P.N.A.S.* 106 (49), 20658-20663.
24. Florescu, M. et al. (2009) "Complete band gaps in two-dimensional photonic quasicrystals," *Physical Review B* 80, 155112.
25. Florescu, M. et al. (2010) "Effects of random link removal on the photonic band gaps of honeycomb networks," *Appl. Phys. Lett.* 97(20), 201103-201103.
26. Stillinger, A. D. F. H. and Torquato, S. (2005) "Unexpected Density Fluctuations in Jammed Disordered Sphere Packings," *Phys. Rev. Lett.* 95, 090604.
27. Zachary, C. E. et al. (2011) "Hyperuniformity, quasi-long-range correlations, and void-space constraints in maximally random jammed particle packings. I. Polydisperse spheres," *Physical Review E* 83(5), 051308.
28. Zachary, C. E. et al. (2011) "Hyperuniformity, quasi-long-range correlations, and void-space constraints in maximally random jammed particle packings. II. Anisotropy in particle shape," *Physical Review E* 83(5), 051309.

29. Lebowitz, J. L. (1983) *Phys. Rev. A* 27, 1491.
30. Batten, R. D. et al. (2008) "Classical disordered ground states: Super-ideal gases and stealth and equi-luminous materials," *J. Appl. Phys.* 104(3), 033504-033512.
31. Xie, R. (2012) Proceedings of the National Academy of Science of the United States of America.
32. Philip, S. S. (2006) "Decay of the pair correlations and small-angle scattering for binary liquids and glasses," *J. Phys.: Condens. Matter* 18(50), 11443.
33. Weaire, D. and Thorpe, M. F. (1971) "Electronic Properties of an Amorphous Solid. I. A Simple Tight-Binding Theory," *Physical Review B* 4(8), 2508-2520.
34. Laaziri, K. et al. (1999) "High resolution radial distribution function of pure amorphous silicon," *Phys. Rev. Lett.* 82, 3460-3463.
35. Roorda, S. et al. (1998) "Edge supported amorphous silicon membranes for diffraction studies," *Nucl. Instrum. & Meth. Phys. Res. B* 148, 360-365.
36. Ilaysky, J. et al. (2009) "Ultra-small-angle X-ray scattering at the Advanced Photon Source," *J. Appl. Crystallogr.* 42(3), 469-479.
37. Waasmaier, D. and Kirfel, A. (1995) "New analytical scattering-factor functions for free atoms and ions," *Acta Crystallographica Section A* 51(3), 416-431.
38. Wochner, P. et al. (2009) "X-ray cross correlation analysis uncovers hidden local symmetries in disordered matter," *P.N.A.S.* 106(28), 11511-11514.
39. Xie, R. et al. (2011) "Order and disorder in freestanding pure amorphous silicon and amorphous silicon over Si(001)," *J. Non-Cryst. Solids* 357, 2498-2501.
40. Haberl, B. et al. (2009) "Structural characterization of pressure-induced amorphous silicon," *Physical Review B* 79(15), 155209.
41. Nakhmanson, S. M. et al. (2001) "Realistic models of paracrystalline silicon," *Physical Review B* 63, 235207.
42. Gibson, J. M. et al. (2010) "Substantial crystalline topology in amorphous silicon," *Phys. Rev. Lett.* 105, 125504.
43. Haberl, B. et al. (2011) "Unexpected short- and medium-range atomic structure of sputtered amorphous silicon upon thermal annealing," *J. Appl. Phys.* 110(9), 096104-096103.
44. Cheng, J.-Y. et al. (2001) "Observations of structural order in ion-implanted amorphous silicon," *J. Mater. Res.* 16, 3030-3033.
45. Moss, S. C. and L, P. D. (1985) "Random packing of structural units and the first sharp diffraction peak in glasses," in *Physics of Disordered Materials* (Adler, D., et al., Eds.), pp 77-94, Plenum, New York.
46. Price, D. L. et al. (1989) "Intermediaterange order in glasses and liquids," *J. Phys.: Condens. Matter* 1, 1005-1008.
47. Steeb, S. and Lamparter, P. (1984) "Diffraction studies of liquid and amorphous-alloys," *J. Non-Cryst. Solids* 61-62, 237-248.
48. Elliot, S. R. (1991) "Origin of the first sharp diffraction peak in the structure factor of covalent glasses," *Phys. Rev. Lett.* 67, 711-714.
49. Blétry, J. (1990) "Sphere and distance models for binary disordered systems," *Philosophical Magazine B* 62, 469-508.
50. Tsu, R. et al. (1984) "Determination of energy barrier for structural relaxation in a-Si and a-Ge by Raman-scattering," *J. Non-Cryst. Solids* 66, 109-114.
51. Tsu, R. et al. (1985) "Determination of the energy barrier for structural relaxation in amorphous Si and Ge by Raman-scattering," *Solid State Commun.* 54, 447-450.
52. Coffa, S. et al. (1992) "Mechanisms of ion-beam-emhanced diffusion in amorphous-silicon," *Physical Review B* 45, 8355-8358.
53. Stolk, P. A. et al. (1994) "Contribution of defects to electronic, structural, and thermodynamic properties of amorphous-silicon," *J. Appl. Phys.* 75, 7266-7286.
54. Roorda, S. et al. (1989) "Calorimetric evidence for structural relaxation in amorphous silicon," *Phys. Rev. Lett.* 62, 1880-1883.
55. Fried, M. et al. (1992) "Determination of complex dielectric functions of ion implanted and implanted annealed amorphous silicon by spectroscopic ellipsometry," *J. Appl. Phys.* 71, 5260-5262.
56. Zammit, U. et al. (1994) "Optical absorption studies of ion-implantation damage in Si on sapphire," *Physical Review B* 49, 14322-14330.

We claim:
1. A composition comprising annealed amorphous silicon, wherein the observed value $S(k\rightarrow 0)$ is less than 0.035.
2. The composition of claim 1, wherein the observed value $S(k\rightarrow 0)$ is less than 0.028.
3. The composition of claim 1, wherein the observed value $S(k\rightarrow 0)$ is less than 0.016.
4. The composition of claim 1, wherein the observed value $S(k\rightarrow 0)$ is approximately 0.0075.
5. A method comprising:
   a) thermal annealing amorphous silicon for at least one hour under conditions that produce annealed amorphous silicon having an observed value $S(k\rightarrow 0)$ less than 0.035, and
   b) measuring the degree of hyperuniformity of said annealed amorphous silicon.
6. The method of claim 5, wherein hyperuniformity is measured by determining the observed value $S(k\rightarrow 0)$.
7. The method of claim 6, wherein the observed value $S(k\rightarrow 0)$ is less than 0.028.
8. The method of claim 6, wherein the observed value $S(k\rightarrow 0)$ is less than 0.016.
9. The method of claim 6, wherein the observed value $S(k\rightarrow 0)$ is approximately 0.0075.
10. The method of claim 5, wherein said thermal annealing is under pressure.
11. The method of claim 10, wherein said pressure compresses said amorphous silicon by from 6% to 10%.
12. The method of claim 10, wherein said pressure is from 10 to 30 gigapascals (GPa).
13. The method of claim 5, wherein said thermal annealing is between 400° and 800° Centigrade.
14. The method of claim 5, further comprising quenching said annealed amorphous silicon.
15. The method of claim 14, wherein said quenching is at zero pressure.
16. The method of claim 14, wherein said quenching is under pressure.
17. The method of claim 16, wherein said pressure compresses said annealed amorphous silicon by from 6% to 10%.
18. The method of claim 16, wherein said pressure is from 10 to 30 gigapascals (GPa).
19. A composition comprising annealed amorphous silicon produced by the method of claim 5, and having an observed value $S(k\rightarrow 0)$ less than 0.028.
20. A method comprising:
   a) thermal annealing amorphous silicon for at least one hour under pressure to produce annealed amorphous silicon, and b) quenching said annealed amorphous silicon under pressure to produce quenched annealed amorphous silicon having an observed value S(k→0) less than 0.028.

21. The method of claim 20, further comprising measuring the degree of hyperuniformity of one or both of said annealed amorphous silicon, and said quenched annealed amorphous silicon.

22. A composition comprising quenched annealed amorphous silicon produced by the method of claim 21, and having an observed value S(k→0) less than 0.028.

* * * * *